(12) United States Patent  
Morikazu

(10) Patent No.: US 7,767,550 B2  
(45) Date of Patent: Aug. 3, 2010

(54) WAFER LASER PROCESSING METHOD AND LASER PROCESSING EQUIPMENT

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 144 days.

(21) Appl. No.: 12/018,663

(22) Filed: Jan. 23, 2008

(65) Prior Publication Data

US 2008/0242055 A1 Oct. 2, 2008

(30) Foreign Application Priority Data

Feb. 5, 2007 (JP) ............................. 2007-025352

(51) Int. Cl.
*H01L 21/301* (2006.01)
(52) U.S. Cl. .................. 438/460; 438/463; 219/121.76; 219/121.85; 257/E21.214; 257/E21.347
(58) Field of Classification Search ......... 438/460–465; 219/121.76, 121.67, 121.68, 121.69, 121, 219/82, 121.85

See application file for complete search history.

(56) References Cited

U.S. PATENT DOCUMENTS 6,257,224 B1 7/2001 Yoshino et al.
7,241,669 B2 * 7/2007 Swenson et al. ............. 438/463
7,473,866 B2 * 1/2009 Morishige et al. ...... 219/121.76

FOREIGN PATENT DOCUMENTS

JP 10-305420 11/1998

OTHER PUBLICATIONS

English language Abstract of JP 10-305420.

* cited by examiner

*Primary Examiner*—Hsien-ming Lee
(74) *Attorney, Agent, or Firm*—Greenblum & Bernstein, P.L.C.

(57) ABSTRACT

A wafer laser processing method for forming a groove in a wafer having a plurality of areas which are sectioned by streets formed in a lattice pattern on the front surface of a substrate, a device being formed in each of the plurality of areas, and an insulating film being formed on the surfaces of the devices, by applying a pulse laser beam along the streets, the method comprising a heating step for applying a first pulse laser beam set to an output for preheating the insulating film so as to soften it to the insulating film and a processing step for applying a second pulse laser beam set to an output for processing the insulating film and the substrate to the spot position of the first pulse laser beam applied in the heating step, the heating step and the processing step being carried out along the streets alternately.

2 Claims, 6 Drawing Sheets

WAFER LASER PROCESSING METHOD AND LASER PROCESSING EQUIPMENT

FIELD OF THE INVENTION

The present invention relates to a method of carrying out laser processing along streets formed on a wafer such as a semiconductor wafer, and to a laser processing equipment.

DESCRIPTION OF THE PRIOR ART

In the production process of a semiconductor device, a plurality of areas are sectioned by dividing lines called "streets" arranged in a lattice pattern on the front surface of a substantially disk-like semiconductor substrate, and a device such as IC or LSI is formed in each of the sectioned areas. Individual devices are manufactured by cutting this semiconductor wafer along the streets to divide it into the areas each having a device formed thereon. An optical device wafer comprising light receiving devices such as photodiodes or light emitting devices such as laser diodes formed on the front surface of a sapphire substrate is also cut along streets to be divided into individual optical devices such as photodiodes or laser diodes which are widely used in electric appliances.

As a means of dividing the above semiconductor wafer or optical device wafer along the streets, a method in which a groove is formed by applying a pulse laser beam along the streets formed on the wafer and the wafer is divided along the grooves is disclosed by JP-A 10-305420.

In a wafer having an insulating film (made of, for example, $SiO_2/Cu/SiO_2$) on the front surfaces of devices, however, the insulating film is peeled off by the application of a laser beam, thereby damaging each device or reducing the quality of the device.

SUMMARY OF THE INVENTION

It is an object of the present invention to provide a method of carrying out laser processing of a wafer, which can form a groove along streets without peeling an insulating film off even when the wafer has the insulating film coated on the front surface of a substrate, and to a laser processing equipment.

To attain the above object, according to the present invention, there is provided a wafer laser processing method for forming a groove in a wafer having a plurality of areas which are sectioned by streets formed in a lattice pattern on the front surface of a substrate, a device being formed in each of the plurality of areas, and an insulating film being formed on the surfaces of the devices, by applying a pulse laser beam along the streets, the method comprising the following steps:

a heating step for applying a first pulse laser beam set to an output for preheating the insulating film so as to soften it, to the insulating film; and a processing step for applying a second pulse laser beam set to an output for processing the insulating film and the substrate, to the spot position of the first pulse laser beam applied in the heating step;

the heating step and the processing step are carried out along the streets alternately.

The first pulse laser beam has a wavelength of 355 nm and an energy per pulse of 0.06 mJ, and the second pulse laser beam has a wavelength of 355 nm and an energy per pulse of 0.2 mJ.

According to the present invention, there is further provided a laser processing equipment comprising a chuck table for holding a workpiece, a laser beam application means for applying a pulse laser beam to the workpiece held on the chuck table, a processing-feed mechanism for moving the chuck table and the laser beam application means relative to each other in a processing-feed direction at a predetermined processing-feed rate, and an indexing-feed mechanism for moving the chuck table and the laser bean application means in an indexing-feed direction perpendicular to the processing-feed direction, wherein the laser beam application means comprises a laser beam oscillation means for oscillating a pulse laser beam, a pulse laser beam changing means for changing the output of a pulse laser beam oscillated from the laser beam oscillation means to a first output for heating the workpiece and a second output for processing the workpiece, which is larger than the first output, and for deflecting the optical axis of the first pulse laser beam set to the first output and the second pulse laser beam set to the second output, to the processing-feed direction, a condenser for converging the first pulse laser beam and the second pulse laser beam, and a control means for controlling the pulse laser beam changing means; and the control means changes a pulse laser beam oscillated from the laser beam oscillation means between the first pulse laser beam and the second pulse laser beam alternately and controls the pulse laser beam changing means to apply the second pulse laser beam to the spot position of the first pulse laser beam according to the processing-feed rate.

The pulse laser beam changing means is composed of an acousto-optic changing means.

In the laser processing equipment according to the present invention, the insulating film is preheated to be softened by carrying out the heating step for applying the first pulse laser beam set to an output for preheating the insulating film to soften it and then, the processing step for applying the second pulse laser beam set to an output for processing the insulating film and the substrate to the spot position of the first pulse laser beam is carried out. Therefore, as the applied area is softened at the time when a groove is formed in the wafer by applying the second pulse laser beam, even when the insulating film is formed on the front surface of the substrate, it is not peeled by the application of the second pulse laser beam.

DETAILED DESCRIPTION OF THE PREFERRED EMBODIMENTS

Preferred embodiments of the wafer laser processing method and the laser processing equipment of the present invention will be described in detail hereinunder with reference to the accompanying drawings.

Figure 1:
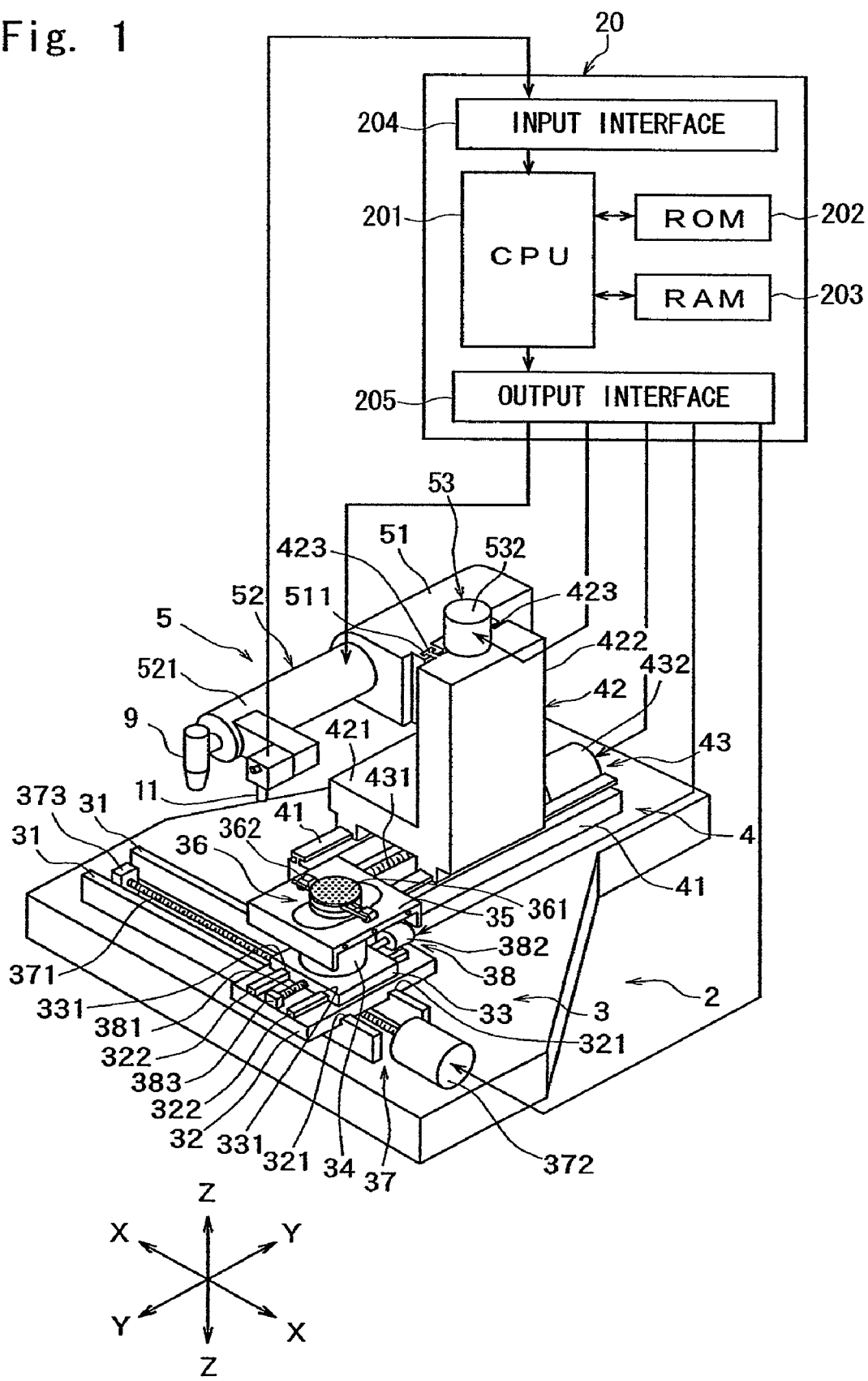
FIG. 1 is a perspective view of a laser processing equipment constituted according to the present invention.

FIG. 1 is a perspective view of a laser processing equipment constituted according to the present invention. The laser processing equipment shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the processing-feed direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31 mounted on the stationary base 2 and arranged parallel to each other in the processing-feed direction indicated by the arrow X, a first sliding block 32 mounted on the guide rails 31 and 31 in such a manner that it can move in the processing-direction indicated by the arrow X, a second sliding block 33 mounted on the first sliding block 32 in such a manner that it can move in the indexing-feed direction indicated by the arrow Y, a cover table 35 supported on the second sliding block 33 by a cylindrical member 34, and a chuck table 36 as a workpiece holding means. This chuck table 36 has an adsorption chuck 361 made of a porous material, and a disk-like wafer as a workpiece is held on the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame for supporting the wafer through a protective tape as will be described later.

The above first sliding block 32 has, on the undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed mechanism 37 for moving the first sliding block 32 along the pair of guide rails 31 and 31 in the processing-feed direction indicated by the arrow X. The processing-feed mechanism 37 comprises a male screw rod 371 arranged between the above pair of guide rails 31 and 31 parallel to each other and a drive source such as a pulse motor 372 for rotary-driving the male screw rod 371. The male screw rod 371 is, at its one end, rotatably supported to a bearing block 373 fixed on the above stationary base 2 and, is at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or adverse direction with the pulse motor 372, the first sliding block 32 is moved along the guide rails 31 and 31 in the processing-feed direction indicated by the arrow X.

The above second sliding block 33 has, on the undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed mechanism 38 for moving the second sliding block 33 along the pair of guide rails 322 and 322 on the first sliding block 32 in the indexing-feed direction indicated by the arrow Y. The first indexing-feed mechanism 38 comprises a male screw rod 381 arranged between the above pair of guide rails 322 and 322 parallel to each other and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or adverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment has a second indexing-feed mechanism 43 for moving the movable support base 42 along the pair of guide rails 41 and 41 in the indexing-feed direction indicated by the arrow Y. This second indexing-feed mechanism 43 comprises a male screw rod 431 arranged between the above pair of guide rails 41 and 41 parallel thereto and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or adverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction (Z direction) indicated by the arrow Z by fitting the to-be-guided grooves 511 and 511 to the above guide rails 423 and 423, respectively.

The laser beam application unit 5 in the illustrated embodiment has a moving means 53 for moving the unit holder 51 along the pair of guide rails 423 and 423 in the direction (Z direction) indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or adverse direction with the pulse motor 532, the unit holder 51 and the laser beam application means 52 are moved along the guide rails 423 and 423 in the direction (Z direction) indicated by the arrow Z. In the illustrated embodiment, the laser beam application means 52 is moved up by driving the pulse motor 532 in the normal direction and moved down by driving the pulse motor 532 in the adverse direction.

Figure 2:
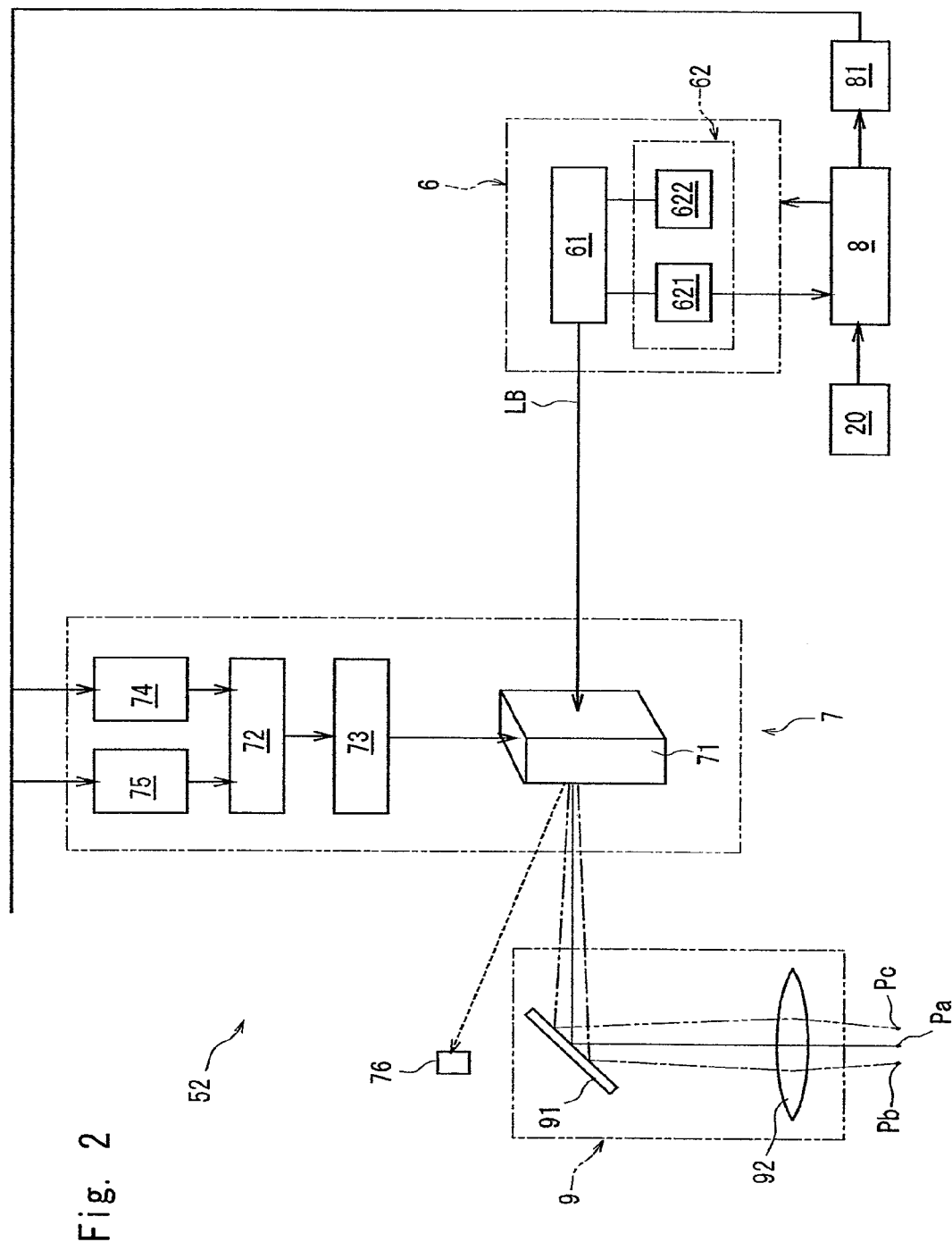
FIG. 2 is a block diagram of a laser beam application means provided in the laser processing equipment shown in FIG. 1.

The above laser beam application means 52 comprises a cylindrical casing 521 extending substantially horizontally, a pulse laser beam oscillation means 6 installed in the casing 521 as shown in FIG. 2, a pulse laser beam changing means 7 for changing the output of a pulse laser beam oscillated from the pulse laser beam oscillation means 6 to a first output for preheating the insulating film of a wafer as the workpiece which will be described later and to a second output for processing the substrate of the wafer and for deflecting the optical axis of a first pulse laser beam set to the first output and the optical axis of a second pulse laser beam set to the second output in the processing-processing-feed direction (X direction), and a control means 8 for controlling the above pulse laser beam oscillation means 6 and the pulse laser beam changing means 7. The laser beam application means 52 further comprises a condenser 9 for applying a pulse laser beam passing through the pulse laser beam changing means 7 to the workpiece held on the above chuck table 36.

The above pulse laser beam oscillation means 6 is constituted by a pulse laser beam oscillator 61 composed of a YAG laser oscillator or YVO4 laser oscillator and a repetition frequency setting means 62 connected to the pulse laser beam oscillator 61. The pulse laser beam oscillator 61 oscillates a pulse laser beam having a predetermined frequency set by the repetition frequency setting means 62. The repetition frequency setting means 62 has an excitation trigger transmitter 621 and an oscillation trigger transmitter 622. In the pulse laser beam oscillation means 6 constituted as described above, the pulse laser beam oscillator 61 starts excitation based on an excitation trigger from the excitation trigger transmitter 621 at predetermined intervals and oscillates a pulse laser beam based on an oscillation trigger from the oscillation trigger transmitter 622 at predetermined intervals.

The above pulse laser beam changing means 7 is composed of an acousto-optic changing means which comprises an acousto-optic device 71 for changing the output of a pulse laser beam oscillated from the pulse laser beam oscillation means 6 and for deflecting the optical axis of the pulse laser beam in the processing-feed direction (X direction), an RF oscillator 72 for generating RF (radio frequency) to be applied to the acousto-optic device 71, an RF amplifier 73 for amplifying the power of RF generated by the RF oscillator 72 to apply it to the acousto-optic device 71, an output adjustment means 74 for adjusting the amplitude of RF generated by the RF oscillator 72 and a deflection angle adjustment means 75 for adjusting the frequency of RF generated by the RF oscillator 72. The above acousto-optic device 71 can adjust the output of a pulse laser beam according to the amplitude of the applied RF and the deflection angle of the optical axis of a pulse laser beam according to the frequency of the applied RF. The above output adjustment means 74 and the above deflection angle adjustment means 75 are controlled by the control means 8.

The pulse laser beam changing means 7 in the illustrated embodiment has a laser beam absorbing means 76 for absorbing a laser beam which is deflected by the acousto-optic device 71 as shown by the broken line in FIG. 2 when RF having a predetermined frequency is applied to the above acousto-optic device 71.

The above control means 8 outputs a driving pulse signal corresponding to the pulse of a pulse laser beam oscillated from the pulse laser beam oscillator 61 to a drive circuit 81 based on an excitation trigger from the above excitation trigger transmitter 621 which is a repetition frequency setting signal from the repetition frequency setting means 62 of the pulse laser beam oscillation means 6. This drive circuit 81 applies a voltage corresponding to the driving pulse signal from the control means 8 to the output adjustment means 74 and the deflection angle adjustment means 75 of the above pulse laser beam changing means 7.

Returning to FIG. 1, the above condenser 9 is mounted on the end of the casing 521 and comprises a direction changing mirror 91 for changing the direction of a pulse laser beam whose output has been adjusted and whose optical axis has been deflected by the above pulse laser beam changing means 7 to a downward direction, and a condenser lens 92 for converging a laser beam whose direction has been changed by the direction changing mirror 91.

The laser beam application means 52 in the illustrated embodiment is constituted as described above, and its function will be described with reference to FIG. 2.

A description will be first given of the method of changing the output of a pulse laser beam oscillated from the pulse laser beam oscillation means 6 by means of the pulse laser beam changing means 7.

In the laser beam application means 52 shown in FIG. 2, a pulse laser beam oscillated from the pulse laser beam oscillation means 6 is set to have a wavelength of 355 nm and an energy per pulse of 0.2 mJ. In the laser beam application means 52 having this pulse laser beam oscillation means 6, when a voltage of, for example, 10 V is applied from the above drive circuit 81 to the output adjustment means 74 of the pulse laser beam changing means 7 to apply RF having an amplitude corresponding to 10 V to the acousto-optic device 71, the output of a laser beam passing through the acousto-optic device 71 has an energy per pulse of 0.2 mJ which is the same as the output of a pulse laser beam oscillated from the pulse laser beam oscillation means 6. When a voltage of, for example, 3 V is applied from the above drive circuit 81 to the output adjustment means 74 of the pulse laser beam changing means 7 to apply RF having an amplitude corresponding to 3V to the acousto-optic device 71, the output of a laser beam passing through the acousto-optic device 71 has an energy per pulse of 0.06 mJ.

A description will be subsequently given of the method of deflecting the optical axis of a pulse laser beam oscillated from the pulse laser beam oscillation means 6 by means of the pulse laser beam changing means 7.

When a voltage of, for example, 10 V is applied from the above drive circuit 81 to the deflection angle adjustment means 75 of the pulse laser beam changing means 7 to apply RF having a frequency corresponding to 10 V to the acousto-optic device 71, the optical axis of a pulse laser beam oscillated from the pulse laser beam oscillation means 6 is deflected as shown by the solid line in FIG. 2 and converges at a focusing point Pa. When a voltage of, for example, 15 V is applied from the above drive circuit 81 to the deflection angle adjustment means 75 to apply RF having a frequency corresponding to 15 V to the acousto-optic device 71, the optical axis of a pulse laser beam oscillated from the pulse laser beam oscillation means 6 is deflected as shown by the dot-and-dash chain line in FIG. 2 and converges at a focusing point Pb which shifts from the above focusing point Pa a predetermined distance in the left direction of the processing-feed direction (X direction) in FIG. 2. Meanwhile, when a voltage of, for example, 5 V is applied from the above drive circuit 81 to the deflection angle adjustment means 75 to apply RF having a frequency corresponding to 5 V to the acousto-optic device 71, the optical axis of a pulse laser beam oscillated from the pulse laser beam oscillation means 6 is deflected as shown by the long dashed double-short dashed line in FIG. 2 and converges at a focusing point Pc which shifts from the above focusing point Pa a predetermined distance in the right direction of the processing-feed direction (X direction) in FIG. 2. When a voltage of, for example, 0 V is applied from the above drive circuit 81 to the deflection angle adjustment means 75 of the pulse laser beam changing means 7 to apply RF having a frequency corresponding to 0 V to the acousto-optic device 71, a pulse laser beam oscillated from the pulse laser beam oscillation means 6 is guided to the laser beam absorbing means 76 as shown by the broken line in FIG. 2. Thus, a laser beam is deflected by the acousto-optic device 71 in the processing-feed direction (X direction) according to a voltage applied to the deflection angle adjustment means 75.

Returning to FIG. 1, the laser processing equipment in the illustrated embodiment comprises an image pick-up means 11 which is attached to the end portion of the casing 521 and detects the area to be processed by the above laser beam application means 52. This image pick-up means 11 is constituted by an infrared illuminating means for applying infrared radiation to the workpiece, an optical system for capturing the infrared radiation applied by the infrared illuminating means and an image pick-up device (infrared CCD) for outputting an electric signal corresponding to the infrared radiation captured by the optical system in addition to an ordinary image pick-up device (CCD) for picking up an image with visible radiation. An image signal picked up is supplied to the control means 8.

With reference to FIG. 1, the laser processing equipment in the illustrated embodiment comprises a controller 20. The controller 20 is composed of a computer which comprises a central processing unit (CPU) 201 for carrying out arithmetic processing based on a control program, a read-only memory (ROM) 202 for storing the control program etc., a read/write random access memory (RAM) 203 for storing the results of operations, an input interface 204 and an output interface 205. Detection signals from the image pick-up means 11 etc. are supplied to the input interface 204 of the controller 20. Control signals are supplied to the above pulse motor 372, the pulse motor 382, the pulse motor 432, the pulse motor 532, the pulse laser beam oscillation means 6 and the control means 8 from the output interface 206 of the controller 20.

The laser processing equipment in the illustrated embodiment is constituted as described above, and its function will be described hereinunder.

Figure 3:
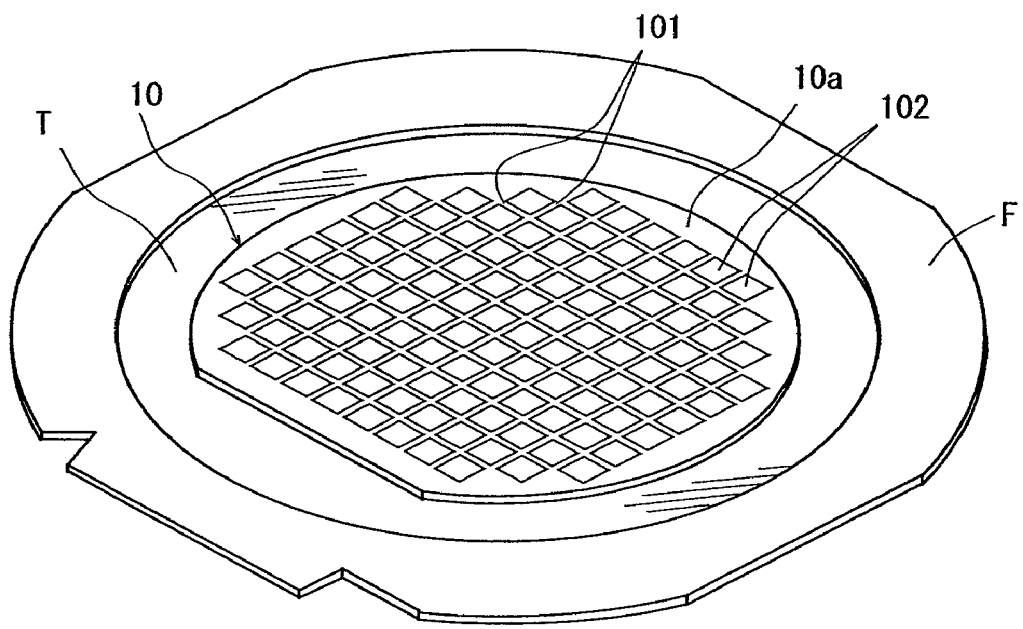
FIG. 3 is a perspective view of a semiconductor wafer as a workpiece which is put on a frame via a protective tape.
Figure 4:
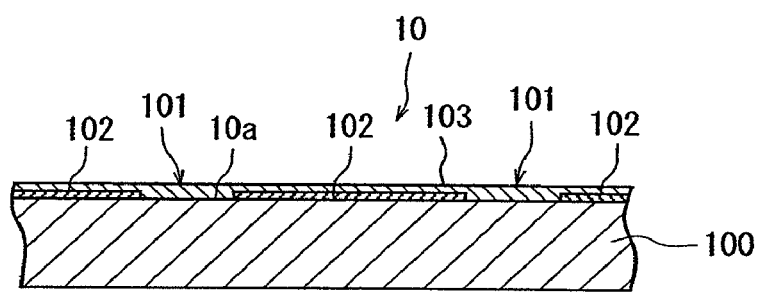
FIG. 4 is an enlarged sectional view of the principal portion of the semiconductor wafer shown in FIG. 3.

The semiconductor wafer as the workpiece to be processed by the above laser processing equipment will be described with reference to FIG. 3 and FIG. 4. In the semiconductor wafer 10 shown in FIG. 3 and FIG. 4, a plurality of areas are sectioned by a plurality of streets 101 formed in a lattice pattern on the front surface 10a of a silicon substrate 100 having a thickness of 80 μm, and a device 102 such as IC or LSI is formed in each of the above sectioned areas. A 5 μm-thick insulating film 103 made of $SiO_2$, Cu and $SiO_2$ is formed on the front surface 10a of this semiconductor wafer 10 as shown in FIG. 4. The rear surface of the semiconductor wafer 10 constituted as described above is put onto a protective tape T which is composed of a synthetic resin sheet such as a polyolefin sheet and mounted on an annular frame F as shown in FIG. 3 in such a manner that the front surface 10a of the semiconductor wafer 10 faces up.

A description will be subsequently given of the processing method of carrying out laser processing along the streets 101 of the above semiconductor wafer 10 with the laser processing equipment shown in FIG. 1 and FIG. 2.

To carry out laser processing along the streets 101 of the above semiconductor wafer 10, the semiconductor wafer 10 is first placed on the chuck table 36 of the laser processing equipment shown in FIG. 1 in such a manner that the front surface 10a faces up and suction-held on the chuck table 36. The annular frame F supporting the protective tape T is fixed by the clamps 362 provided on the chuck table 36.

The chuck table 36 suction-holding the semiconductor wafer 10 as described above is brought to a position right below the image pick-up means 11 by means of the processing-feed mechanism 37. After the chuck table 36 is positioned right below the image pick-up means 11, alignment work for detecting the area to be laser-processed of the semiconductor wafer 10 is carried out by the image pick-up means 11 and the controller 20. That is, the image pick-up means 11 and the controller 20 carry out image processing such as pattern matching, etc. to align a street 101 formed in a predetermined direction of the semiconductor wafer 10 with the above condenser 9, thereby performing the alignment of a laser beam application position. The alignment of the laser beam application position is also carried out on streets 101 formed on the semiconductor wafer 10 in a direction perpendicular to the above predetermined direction.

Figure 5:
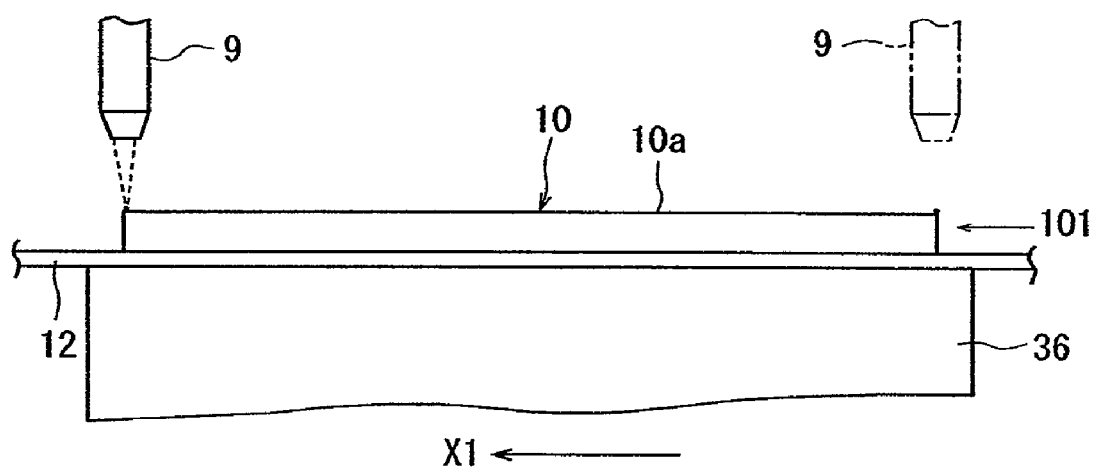
FIG. 5 is an explanatory diagram showing a laser beam application step for laser processing the semiconductor wafer with the laser processing equipment shown in FIG. 1.

After the alignment of the laser beam application position is carried out by detecting the street 101 formed on the semiconductor wafer 10 held on the chuck table 36 as described above, the chuck table is moved to a laser beam application area where the condenser 9 is located as shown in FIG. 5 so as to bring the predetermined street 101 to a position right below the condenser 9. At this point, one end (left end in FIG. 5) of the street 101 of the semiconductor wafer 10 is positioned right below the condenser 9. Thereafter, the chuck table 36 is moved in the processing-feed direction indicated by the arrow X1 in FIG. 5 at a predetermined processing-feed rate while the laser beam application means 52 is activated to apply a first pulse laser beam set to an output for preheating the insulating film 103 of the semiconductor wafer 10 so as to soften it and a second pulse laser beam set to an output for processing the insulating film and the substrate alternately from the condenser 9 (laser beam application step).

The laser beam application step in the case where the laser beam application means 52 shown in FIG. 2 is used will be described hereinbelow.

The processing conditions in the above laser beam application step are set as follows, for example.

Light source: YAG laser
Wavelength: 355 nm
Repetition frequency: 30 kHz
Average output: 6 W
Energy per pulse (first): 0.06 mJ
Energy per pulse (second): 0.2 mJ
Focusing spot diameter: 35 μm
Processing-feed rate: 210 mm/sec In the laser beam application step, the heating step for applying the first pulse laser beam set to an output (energy per pulse of 0.06 mJ) for preheating the insulating film 103 of the above semiconductor wafer 10 so as to soften it and the processing step for applying the second pulse laser beam set to an output (energy per pulse of 0.2 mJ) for processing the insulating film 103 and the silicon substrate 100 to the spot position of the first pulse laser beam applied in the heating step are carried out along the streets 101 alternately. Since the semiconductor wafer 10 is moved in the processing-direction indicated by the arrow X1 in FIG. 5 at a processing-feed rate of 210 mm/sec under the above processing conditions, the semiconductor wafer 10 moves 7 μm in the processing-feed direction while the first pulse laser beam and the second pulse laser beam are applied. Therefore, the second pulse laser beam is applied from the condenser 9 to the spot position of the first pulse laser beam, which has moved 7 μm from a position right below the condenser 9. The method of applying the first pulse laser beam and the second pulse laser beam will be described hereinunder with reference to FIG. 2 and FIGS. 6(a) to 6(c).

To set the output of the first pulse laser beam applied first to an energy per pulse of 0.06 mJ, a voltage of, for example, 3 V is applied from the above drive circuit 81 to the output adjustment means 74 of the pulse laser beam changing means 7 shown in FIG. 2 to apply RF having an amplitude corresponding to 3V to the acousto-optic device 71. As a result, the output (energy per pulse of 0.2 mJ) of a pulse laser beam oscillated from the pulse laser beam oscillation means 6 is changed to an energy per pulse of 0.06 mJ by passing through the acousto-optic device 71. Then, a voltage of, for example, 10 V is applied from the above drive circuit 81 to the deflection angle adjustment means 75 of the pulse laser beam changing means 7 to apply RF having a frequency corresponding to 10 V to the acousto-optic device 71. As a result, the optical axis of the first pulse laser beam having an energy per pulse of 0.06 mJ passing through the acousto-optic device 71 is deflected as shown by the solid line in FIG. 2 and FIG. 6(a) and converges at the focusing point Pa. The spot of the first pulse laser beam is represented by (S1) in FIG. 6(b). As a result, the surface of the street 101 is preheated at about 1,000° C. by the energy (0.06 mJ per pulse) of the first pulse laser beam, and the insulating film 103 (see FIG. 4) formed on the front surface 10a of the semiconductor wafer 10 is softened (heating step).

Figure 6:
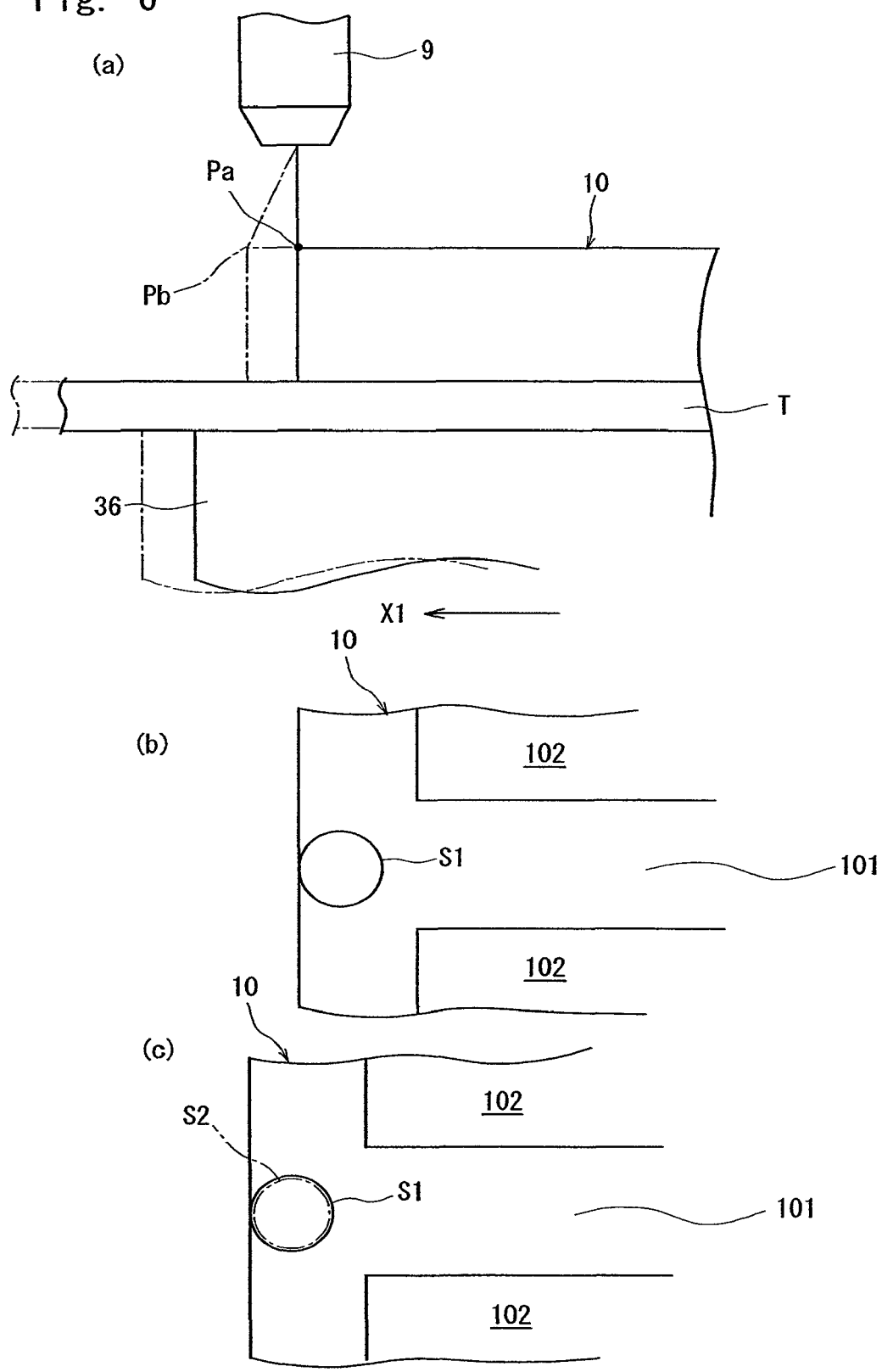
FIGS. 6(a) to 6(c) are explanatory diagrams showing a heating step and a processing step in the laser beam application step shown in FIG. 5.

Then, in order to apply the second pulse laser beam having an energy per pulse of 0.2 mJ to the spot (S1) position of the above first pulse laser beam, a voltage of, for example, 10 V is applied from the above drive circuit 81 to the output adjustment means 74 of the pulse laser beam changing means 7 shown in FIG. 2 to apply RF having an amplitude corresponding to 10 V to the acousto-optic device 71. As a result, the output (energy per pulse of 0.2 mJ) of a pulse laser beam oscillated from the pulse laser beam oscillation means 6 still has an energy per pulse of 0.2 mJ even after it passes through the acousto-optic device 71. Since the semiconductor wafer 10 moves 7 μm in the processing-feed direction indicated by the arrow X1 as shown by the dot-and-dash chain line in FIG. 6(a) when the second pulse laser beam is applied, a voltage of, for example, 15 V is applied from the above drive circuit 81 to the deflection angle adjustment means 75 to apply RF having a frequency corresponding to 15 V to the acousto-optic device 71. As a result, the optical axis of the second pulse laser beam having an energy per pulse of 0.2 mJ passing through the acousto-optic device 71 converges at the focusing point Pb which shifts 7 μm from the focusing point Pa of the first pulse laser beam in the processing-feed direction (X direction) as shown by the dot-and-dash chain line in FIG. 2 and FIG. 6(a). Therefore, the spot (S2) of the second pulse laser beam is applied to the spot (S1) position of the first pulse laser beam as shown in FIG. 6(c). Since the insulating film 103 (see FIG. 4) formed on the front surface 10a of the semiconductor wafer 10 is softened by the application of the first pulse laser beam at this point as described above, even when the second pulse laser beam is applied, the insulating film 103 is not peeled and the insulating film 103 and the silicon substrate 100 are processed (processing step).

Figure 7:
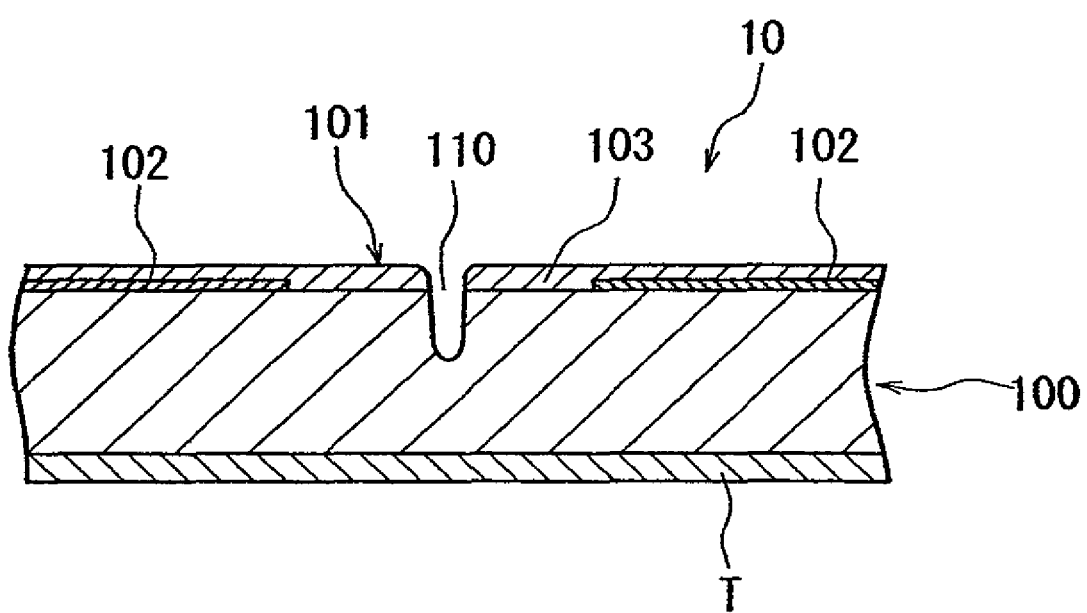
FIG. 7 is an enlarged sectional view of the principal portion of the semiconductor wafer which has been processed by the wafer laser processing method of the present invention.

By carrying out the heating step and the processing step alternately while the semiconductor wafer 10 is moved at a predetermined processing-feed rate as described above, a groove 110 is formed along the street 101 in the semiconductor wafer 10 as shown in FIG. 7.

After the above laser beam application step is carried out along all the streets 101 formed in the predetermined direction of the semiconductor wafer 10, the chuck table 36 is turned at 90° to turn the semiconductor wafer 10 held on the chuck table 36 at 90°. The laser beam application step consisting of the above heating step and the processing step is then carried out along all the streets 101 formed in a direction perpendicular to the above predetermined direction in the semiconductor wafer 10.

After the above laser beam application step is carried out along all the streets 101 formed on the semiconductor wafer 10, the semiconductor wafer 10 is carried to a dividing step that is the subsequent step.

What is claimed is:

1. A wafer laser processing method for forming a groove in a wafer having a plurality of areas which are sectioned by streets formed in a lattice pattern on the front surface of a substrate, a device being formed in each of the plurality of areas, and an insulating film being formed on the surfaces of the devices, by applying a pulse laser beam along the streets, the method comprising:
   moving the wafer at a processing feed rate in a processing feed direction;
   applying a first pulse laser beam set at an output to preheat the insulating film so as to soften the insulating film at a spot position in the processing feed direction; and
   applying a second pulse laser beam set at an output to process the insulating film and the substrate at the spot position of the first pulse laser beam;
   the preheating and the processing are carried out along the streets alternately at subsequent spot positions along the processing feed direction.

2. The wafer laser processing method according to claim 1, wherein the first pulse laser beam has a wavelength of 355 nm and an energy per pulse of 0.06 mJ, and the second pulse laser beam has a wavelength of 355 nm and an energy per pulse of 0.2 mJ.

* * * * *